US008279002B2

(12) United States Patent
Kawashima et al.

(10) Patent No.: US 8,279,002 B2
(45) Date of Patent: Oct. 2, 2012

(54) VARIABLE GAIN AMPLIFIER CIRCUIT

(75) Inventors: Takahiro Kawashima, Osaka (JP); Rui Kurihara, Osaka (JP)

(73) Assignees: Sanyo Electric Co., Ltd., Moriguchi-shi, Osaka (JP); Sanyo Semiconductor Co., Ltd., Ora-Gun, Gunma (JP)

( * ) Notice: Subject to any disclaimer, the term of this patent is extended or adjusted under 35 U.S.C. 154(b) by 29 days.

(21) Appl. No.: 12/909,763

(22) Filed: Oct. 21, 2010

(65) Prior Publication Data
US 2011/0260789 A1 Oct. 27, 2011

(30) Foreign Application Priority Data

Oct. 21, 2009 (JP) .................................. 2009-242711

(51) Int. Cl.
*H03G 3/20* (2006.01)
(52) U.S. Cl. ...................................................... 330/144
(58) Field of Classification Search .................... 330/86, 330/144, 282, 284
See application file for complete search history.

(56) References Cited

U.S. PATENT DOCUMENTS

| 4,048,576 A * | 9/1977 | Blackburn et al. ............ 330/284 |
| 5,027,083 A * | 6/1991 | Kutzavitch et al. ........... 330/284 |
| 7,248,107 B2 * | 7/2007 | Brekelmans et al. ............ 330/86 |
| 2006/0197592 A1* | 9/2006 | Chang ............................. 330/86 |

FOREIGN PATENT DOCUMENTS
JP  2008-301035  12/2008

OTHER PUBLICATIONS

Patent Abstracts of Japan, Publication No. 2008-301035, Publication Date: Dec. 11, 2008, 1 page.
Mechanical English translation of Japanese patent application with Publication No. 2008-301035, Publication Date: Dec. 11, 2008, 8 pages.

* cited by examiner

*Primary Examiner* — Steven J Mottola
(74) *Attorney, Agent, or Firm* — Osha Liang LLP

(57) ABSTRACT

A variable gain amplifier circuit includes: an operational amplifier having a non-inverting input terminal applied with a predetermined voltage; a feedback resistor having one end connected to an inverting input terminal of the operational amplifier and the other end connected to an output terminal of the operational amplifier; and a variable resistor having one end applied with an input voltage and the other end connected to the inverting input terminal of the operational amplifier.

5 Claims, 2 Drawing Sheets

US 8,279,002 B2

VARIABLE GAIN AMPLIFIER CIRCUIT

CROSS-REFERENCE TO RELATED APPLICATION

This application claims the benefit of priority to Japanese Patent Application No. 2009-242711, filed Oct. 21, 2009, of which full contents are incorporated herein by reference.

BACKGROUND OF THE INVENTION

1. Field of the Invention

The present invention relates to a variable gain amplifier circuit.

2. Description of the Related Art

In an integrated circuit such as an optical pickup IC, a variable gain amplifier circuit which amplifies an input signal with a desired gain may be used. FIG. 2 depicts a configuration of a typical variable gain amplifier circuit (hereinafter, VGA: Variable Gain Amplifier) 100 (see, e.g., Japanese Laid-Open Patent Publication No. 2008-301035). The VGA 100 includes an operational amplifier 110, resistors 120 to 122, switches 130, 131, and a capacitor 140. It is assumed that the resistance values of the resistors 120 to 122 are R0 to R2, respectively. For example, when only the switch 130 is turned on, the resistor 121 is connected between an inverting input terminal and an output terminal of the operational amplifier 110. Therefore, the magnitude of the direct-current gain of the VGA 100 is R1/R0. For example, when only the switch 131 is turned on, the magnitude of the direct-current gain of the VGA 100 is R2/R0. As such, ON/OFF of the switches 130, 131 is controlled, to change the magnitude of the direct-current gain of the VGA 100. The capacitor 140 connected between the inverting input terminal and the output terminal of the operational amplifier 110 has a capacitance which limits the frequency band of the VGA 100.

The resistors 130, 131 are feedback resistors and have parasitic capacitances. Therefore, if the switches 130, 131 are switched ON/OFF, a capacitance value of a feedback loop of the operational amplifier 110 may be changed and a phase margin of the operational amplifier 110 may deteriorate. If the phase margin of the operational amplifier 110 deteriorates, the VGA 100 may oscillate.

SUMMARY OF THE INVENTION

A variable gain amplifier circuit according to an aspect of the present invention, includes: an operational amplifier having a non-inverting input terminal applied with a predetermined voltage; a feedback resistor having one end connected to an inverting input terminal of the operational amplifier and the other end connected to an output terminal of the operational amplifier; and a variable resistor having one end applied with an input voltage and the other end connected to the inverting input terminal of the operational amplifier.

Other features of the present invention will become apparent from descriptions of this specification and of the accompanying drawings.

BRIEF DESCRIPTION OF THE DRAWINGS

For more thorough understanding of the present invention and advantages thereof, the following description should be read in conjunction with the accompanying drawings, in which.

DETAILED DESCRIPTION OF THE INVENTION

At least the following details will become apparent from descriptions of this specification and of the accompanying drawings.

Figure 1:
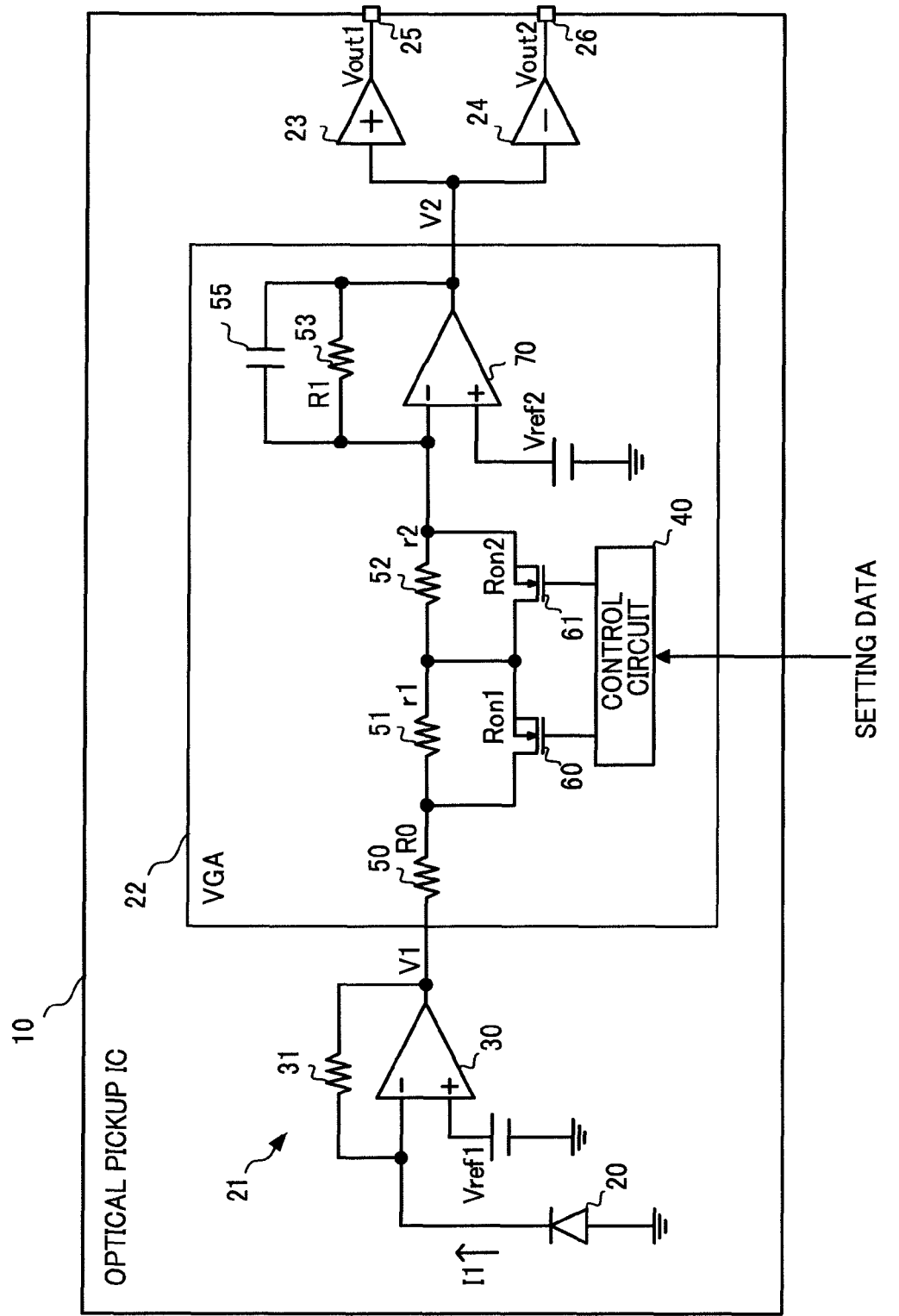
FIG. 1 is a diagram illustrating a configuration of an optical pickup IC 10 according to an embodiment of the present invention.
Figure 2:
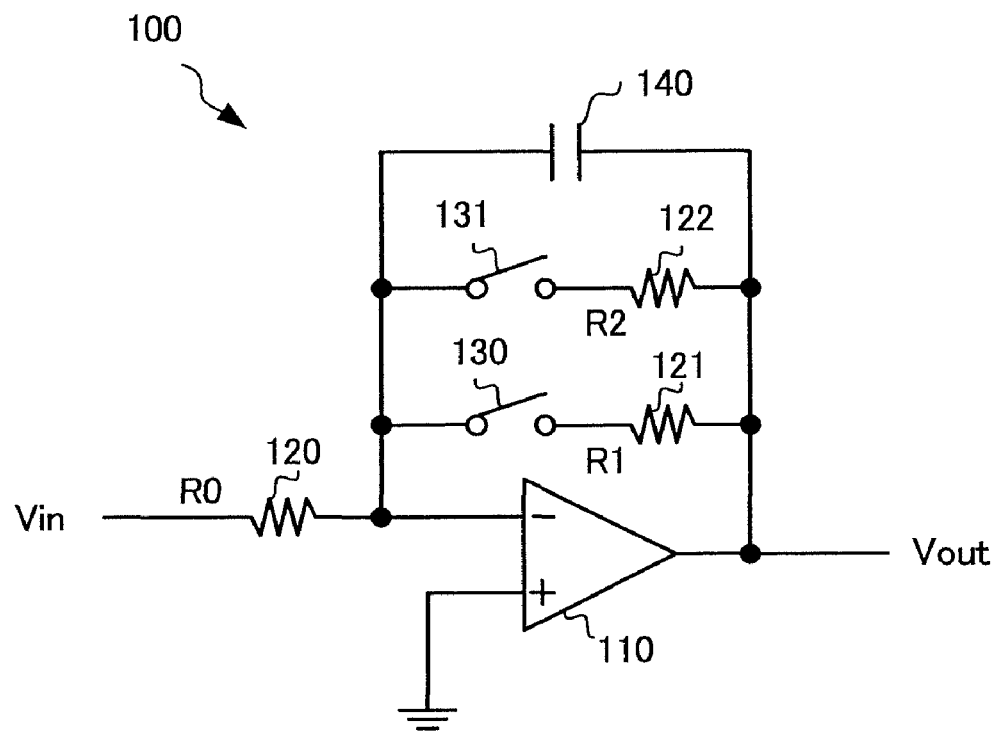
FIG. 2 is a diagram illustrating a configuration of a typical VGA 100.

FIG. 1 is a diagram illustrating a configuration of an optical pickup IC 10 according to an embodiment of the present invention. The optical pickup IC 10 is a circuit that receives laser light from an optical pickup (not shown), to be converted into an electric signal, for example. The optical pickup IC 10 includes a photodiode 20, a current-voltage converting circuit 21, a VGA 22, buffer amplifiers 23, 24, and terminals 25, 26.

The photodiode 20 generates a current I1 corresponding to intensity of the received laser light.

The current-voltage converting circuit 21 is a circuit that converts the current I1 into a voltage V1, and includes an operational amplifier 30 and a resistor 31. A reference voltage Vref1 is applied to a non-inverting input terminal of the operational amplifier 30. The resistor 31 is connected between an inverting input terminal and an output terminal of the operational amplifier 30. Therefore, the output terminal of the operational amplifier 30 generates the voltage V1 which varies around the reference voltage Vref1 according to the product of a current value of the current I1 and a resistance value of the resistor 31.

The VGA 22 is a circuit that amplifies the voltage V1 with a gain which is based on setting data, and includes a control circuit 40, resistors 50 to 53, a capacitor 55, NMOS transistors 60, 61, and an operational amplifier 70.

The control circuit 40 controls ON/OFF of the NMOS transistors 60, 61 based on, e.g., two-bit setting data which is input from, e.g., a microcomputer (not shown). The control circuit 40 includes a memory that stores the setting data. The control circuit 40 turns off both of the NMOS transistors 60, 61 if setting data (0, 0) is input thereto, and turns on the NMOS transistor 60 and turns off the NMOS transistor 61 if setting data (1, 0) is input thereto. The control circuit 40 turns off the NMOS transistor 60 and turns on the NMOS transistor 61, if setting data (0, 1) is input thereto. The control circuit 40 turns on both of the NMOS transistors 60, 61, if setting data (1, 1) is input thereto.

The resistors 50 to 52 are connected in series between the output terminal of the operational amplifier 30 and an inverting input terminal of the operational amplifier 70. A node connected to the resistor 50 (first resistor) and the resistor 51 is connected to a drain of the NMOS transistor 60 (switch element), and a node connected to the resistor 51 and the resistor 52 is connected to a source of the NMOS transistor 60. The node connected to the resistor 51 and the resistor 52 is connected to a drain of the NMOS transistor 61 (switch element), and a node connected to the resistor 52 and the inverting input terminal of the operational amplifier 70 is connected to the source of the NMOS transistor 61. Therefore, a resistance value of a resistor connected between the output terminal of the operational amplifier 30 and the inverting input terminal of the operational amplifier 70, i.e., a resistor on the input side of the operational amplifier 70, is changed in accordance with the state of the NMOS transistors 60, 61. The resistors 50 to 52 correspond to a variable resistor, the resistors 51, 52 correspond to a second resistor, and the NMOS transistors 60, 61 correspond to a switch circuit.

The resistor 53 is a feedback resistor connected between the inverting input terminal and the output terminal of the operational amplifier 70. The capacitor 55 is connected between the inverting input terminal and the output terminal of the operational amplifier 70 as is the case with the resistor 53. Therefore, the operational amplifier 70 operates as an inverting amplifier circuit that inverts and amplifies the voltage V1 with a ratio between the impedance of the resistor on the input side of the operational amplifier 70 and the impedance of the resistor 53 and the condenser 55. Since a reference voltage Vref2 is applied to a non-inverting input terminal of the operational amplifier 70, a voltage V2 of the output terminal of the operation amplifier varies around the reference voltage Vref2.

The buffer amplifier 23 outputs to the terminal 25 a voltage Vout1 obtained by amplifying the voltage V2 with a predetermined gain. The buffer amplifier 24 outputs to the terminal 26 a voltage Vout2 obtained by inverting and amplifying the voltage V2 with a predetermined gain. The voltage V2 is amplified by the buffer amplifiers 23, 24 in a differential manner.

==Direct-Current Gain of VGA 22==

A description will be given of the voltage V2 output from the VGA 22 when different setting data are set. In an embodiment according to the present invention, the resistance values of the resistor 50, the resistor 51, the resistor 52, and the resistor 53 are denoted by R0, r1, r2, and R1, respectively, and the on-resistances of the NMOS transistor 60 and the NMOS transistor 61 are denoted by Ron1 and Ron2, respectively. It is assumed that each of the on-resistances Ron1 and Ron2 is sufficiently smaller than the resistances r1, r2. The resistors 50 to 52 and the NMOS transistor 60, 61 are designed such that the resistance values R0, r1, and r2 satisfy R0>>r1>r2 and that the resistance values R0, r1//Ron1, and r2//Ron2 satisfy R0>>r1//Ron1>r2//Ron2. Therefore, a combined resistor determined by the resistor 52 and the on-resistance Ron2 is smaller than a combined resistor determined by the resistor 51 and the on-resistance Ron1, and values of the combined resistors serially connected to the resistor 50 in decreasing order of resistance value from the resistor 50 side. It is also assumed that the reference voltage Vref2 is 0 (zero) V, for example.

Both of the NMOS transistors 60, 61 are turned off if the setting data (0, 0) is set in the control circuit 40, and thus, a direct-current gain A(0, 0) of the VGA 22 is −R1/(R0+r1+r2). The direct-current gain of the VGA 22 corresponding to the setting data (0, 0) set in the control circuit 40 will hereinafter be denoted as the direct-current gain A(0, 0).

Therefore, the voltage V2 is expressed as follows:

$$V2=(-R1/(R0+r1+r2))\times V1 \quad (1).$$

If the setting data (1, 0) is set in the control circuit 40, the NMOS transistor 60 is turned on and the NMOS transistor 61 is turned off. Therefore, a direct-current gain A(1, 0) is −R1/(R0+r1//Ron1+r2). Thus, the voltage V2 is expressed as follows:

$$V2=(-R1/(R0+r1//Ron1+r2))\times V1 \quad (2).$$

If the setting data (0, 1) is set in the control circuit 40, the NMOS transistor 60 is turned off and the NMOS transistor 61 is turned on. Thus, a direct-current gain A(0, 1) is −R1/(R0+r1+r2//Ron2). Therefore, the voltage V2 is expressed as follows:

$$V2=(-R1/(R0+r1+r2//Ron2))\times V1 \quad (3).$$

If the setting data (1, 1) is set in the control circuit 40, both of the NMOS transistors 60, 61 are turned on. Thus, a direct-current gain A(1, 1) is −R1/(R0+r1//Ron1+r2//Ron2). Therefore, the voltage V2 is as follows:

$$V2=(-R1/(R0+r1//Ron1+r2//Ron2))\times V1 \quad (4).$$

As described above, each of the on-resistances Ron1 and Ron2 is sufficiently smaller than the resistances r1, r2, and R0>>r1>r2 is satisfied. Therefore, the magnitudes of the direct-current gains of the VGA 22 satisfy A(1, 1)>A(1, 0)>A(0, 1)>A(0, 0). As such, in the VGA 22 according to an embodiment of the present invention, the direct-current gain is able to be changed in accordance with the setting data.

==Operation of Optical Pickup IC 10==

A description will be given of the operation of the optical pickup IC 10. It is assumed that the setting data (1, 1) is set in the control circuit 40, for example.

When laser light from an optical pickup (not shown) is received by the photodiode 20, the voltage V1 is generated in accordance with the intensity of the laser light. The voltage V1 is amplified with the direct-current gain A(1, 1), and is output as the voltage V2 to the buffer amplifiers 23, 24. As a result, the voltage V2 is differentially amplified and is output as the voltages Vout1 and Vout2 to the terminals 25 and 26, respectively.

The description has been given of the optical pickup IC 10 according to an embodiment of the present invention. In the VGA 22 of an embodiment of the present invention, in order to change the direct-current gain, a resistance value of the resistor on the input side of the operational amplifier 70 is changed without the resistor 53 provided on the feedback loop of the operational amplifier 70 being changed. Therefore, since a capacitance value of the feedback loop of the operational amplifier 70 does not change in the VGA 22, the effect of the feedback loop on the phase margin of the operational amplifier 70 can be reduced. Thus, as compared to a common VGA such as those in which a resistor provided on the feedback loop is changed, for example, the VGA 22 stably operates.

In the VGA 22, the resistors 50 to 52 connected in series are provided between the node applied with the voltage V1, i.e., the output terminal of the operational amplifier 30 and the inverting input terminal of the operational amplifier 70. The resistors 51, 52 are provided with the NMOS transistors 60, 61 in parallel. In an embodiment of the present invention, the resistance value on the input side of the operational amplifier 70 can easily be changed by the NMOS transistors 60, 61 being switched on/off.

Among the serially connected resistors 50 to 52, the resistor 50 applied with the voltage V1 is not connected in parallel with an NMOS transistor, etc. Therefore, in the VGA 22, a reference direct-current gain is R1/R0, which is determined by a ratio between the resistance value R0 of the resistor 50 and the resistance value R1 of the resistor 53.

In the VGA 22, the two NMOS transistors 60, 61 which are controlled by two-bit setting data are connected in parallel with the resistors 51, 52, respectively. Therefore, the VGA 22 can acquire four different direct-current gains. As such, in the VGA 22, the resistance value on the input side is changed by the two resistors and the two NMOS transistors, however, n resistors serially connected on the input side of the operational amplifier 70 and NMOS transistors respectively connected in parallel with the n resistors may be provided, for example. In this case, $2^n$ different direct-current gains can be acquired. For example, even if n resistors are used, a combined resistor is calculated more easily when n resistors are connected in series, as compared to the case in which n resistors are connected in parallel. Therefore, particularly if the number of resistors which are connected on the input side of the operational amplifier 70 is increased, the burden in design can be alleviated by connecting n resistors in series as in the case of an embodiment of the present invention.

The on-resistances Ron1, Ron2 are generally changed in accordance with drain-source voltages of the NMOS transistors 60, 61, respectively. In an embodiment of the present invention, the resistance value R0 of the resistor 50 is set greater than each of the resistance values r1, r2 of the resistors 51, 52. Therefore, even if the voltage V1 is significantly changed, change in each of the voltages of the resistors 51, 52 is smaller than change in the voltage of the resistor 50. That is, in the VGA 22, even if the voltage V1 is significantly changed, the change can be reduced in the drain-source voltages of the NMOS transistors 60, 61. Therefore, in the VGA 22, since change in the on-resistances Ron1, Ron2 is small relative to change in the voltage V1, an accurate direct-current gain can be acquired.

In an embodiment of the present invention, the resistance value r1 of the resistor 51 is set greater than the resistance value r2 of the resistor 52. Therefore, even if the voltage V1 is significantly changed, change in the voltage of the resistor 52 is reduced. That is, in the VGA 22, even if the voltage V1 is significantly changed, change in the drain-source voltage of the NMOS transistor 61 can be reduced. Specifically, for example, when the drain-source voltage of the NMOS transistor 61 is denoted by Vds, if the setting data (0, 1) is set, Vds=((r2//Ron2)/(R0+r1+r2//Ron2))×V1 is satisfied. It is assumed herein that the source voltage of the NMOS transistor 61 is equivalent to Vref2=0V. When the numerator and the denominator on the right-hand side of the voltage Vds are divided by (R0+r1), Vds=((r2//Ron2)/(R0+r1))/(1+(r2//Ron2)/(R0+r1)))×V1 is obtained. As described above, since the resistance value r1>the resistance value r2 is satisfied, (r2//Ron2)/(R0+r1) is smaller as compared with the case of the resistance value r1<the resistance value r2, for example. As a result, in an embodiment of the present invention, even if the voltage V1 is significantly changed, a value of the on-resistance Ron2 of the NMOS transistor 60 is substantially constant, since change in the voltage Vds is suppressed. Therefore, in the VGA 22 according to an embodiment of the present invention, an accurate direct-current gain can be acquired.

The above embodiments of the present invention are simply for facilitating the understanding of the present invention and are not in any way to be construed as limiting the present invention. The present invention may variously be changed or altered without departing from its spirit and encompass equivalents thereof.

What is claimed is:

1. A variable gain amplifier circuit comprising:
an operational amplifier having a non-inverting input terminal applied with a predetermined voltage;
a feedback resistor having a constant resistance value, the feedback resistor having one end connected to an inverting input terminal of the operational amplifier and the other end connected to an output terminal of the operational amplifier;
a capacitor having one end connected to the inverting input terminal of the operational amplifier and the other end connected to the output terminal of the operational amplifier; and a variable resistor having one end applied with an input voltage and the other end connected to the inverting input terminal of the operational amplifier, wherein
the variable resistor includes:
a first resistor provided between a node applied with the input voltage and the inverting input terminal,
a second resistor connected in series with the first resistor, and
a switch circuit connected in parallel with the second resistor.

2. The variable gain amplifier circuit of claim 1, wherein
the first resistor has one end applied with the input voltage, and wherein
the second resistor is provided between the other end of the first resistor and the inverting input terminal.

3. The variable gain amplifier circuit of claim 2, wherein
the second resistor includes a plurality of resistors connected in series, and wherein
the switch circuit includes a plurality of switch elements connected in parallel with the plurality of resistors, respectively.

4. The variable gain amplifier circuit of claim 3, wherein
the first resistor has a resistance value greater than a resistance value of each of the plurality of resistors, and wherein
the switch element is a MOS transistor having a drain connected to one end of any one corresponding resistor of the plurality of resistors and a source connected to the other end of the any one resistor.

5. The variable gain amplifier circuit of claim 4, wherein
combined resistors, which are determined by the plurality of resistors and on-resistances of the respective MOS transistors connected thereto, are in decreasing order of resistance value from a side connected to the first resistor.

* * * * *